(12) United States Patent
Ranish et al.

(10) Patent No.: US 10,202,707 B2
(45) Date of Patent: Feb. 12, 2019

(54) SUBSTRATE PROCESSING SYSTEM WITH LAMPHEAD HAVING TEMPERATURE MANAGEMENT

(71) Applicant: APPLIED MATERIALS, INC., Santa Clara, CA (US)

(72) Inventors: Joseph M. Ranish, San Jose, CA (US); Paul Brillhart, Pleasanton, CA (US); Satheesh Kuppurao, San Jose, CA (US); Dongming Iu, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1114 days.

(21) Appl. No.: 13/865,672

(22) Filed: Apr. 18, 2013

(65) Prior Publication Data
US 2013/0298832 A1 Nov. 14, 2013

Related U.S. Application Data

(60) Provisional application No. 61/707,938, filed on Sep. 29, 2012, provisional application No. 61/638,619, filed on Apr. 26, 2012.

(51) Int. Cl.
*F21V 7/00* (2006.01)
*C30B 25/10* (2006.01)

(52) U.S. Cl.
CPC .......... *C30B 25/105* (2013.01); *F21V 7/0083* (2013.01)

(58) Field of Classification Search
CPC .................. C30B 25/105; F21V 7/0083
See application file for complete search history.

(56) References Cited

U.S. PATENT DOCUMENTS 4,047,496 A * 9/1977 McNeilly ................ C30B 25/12
  118/725
5,002,630 A   3/1991 Kermani et al.
5,108,792 A   4/1992 Anderson et al.
(Continued)

FOREIGN PATENT DOCUMENTS

JP    H04-297581 A1   10/1992
JP    08-045863 A      2/1996
(Continued)

OTHER PUBLICATIONS

Search Report dated May 16, 2016 received from the State Intellectual Property Office of the People's Republic of China for China Application No. 2013800213162.
(Continued)

*Primary Examiner* — Charles Capozzi
*Assistant Examiner* — Mirza Israr Javed
(74) *Attorney, Agent, or Firm* — Moser Taboada; Alan Taboada

(57) ABSTRACT

Apparatus for processing a substrate are provided herein. In some embodiments, a lamphead for use in substrate processing includes a monolithic member having a contoured surface; a plurality of reflector cavities disposed in the contoured surface, wherein each reflector cavity is shaped to act as a reflector or to receive a replaceable reflector for a lamp; and a plurality of lamp passages, wherein each lamp passage extends into the monolithic member from one of the plurality of reflector cavities.

18 Claims, 8 Drawing Sheets

(56) References Cited

U.S. PATENT DOCUMENTS

| | | | |
|---|---|---|---|
| 5,156,820 A * | 10/1992 | Wong | B01J 19/0013 118/725 |
| 6,007,635 A * | 12/1999 | Mahawili | C23C 16/4584 118/500 |
| 6,121,579 A * | 9/2000 | Aoki | C23C 16/481 118/730 |
| 6,300,601 B1 | 10/2001 | Suzuki | |
| 6,476,362 B1 * | 11/2002 | Deacon | H01L 21/67115 118/50.1 |
| 8,294,068 B2 | 10/2012 | Ranish et al. | |
| 8,314,368 B2 | 11/2012 | Ranish et al. | |
| 2002/0150395 A1 | 10/2002 | Shimizu et al. | |
| 2004/0013419 A1 | 1/2004 | Sakuma et al. | |
| 2007/0077355 A1 * | 4/2007 | Chacin | C23C 16/52 427/248.1 |
| 2007/0116443 A1 * | 5/2007 | Ptak | C23C 16/481 392/407 |
| 2008/0072820 A1 | 3/2008 | Burrows et al. | |
| 2010/0059497 A1 * | 3/2010 | Ranish | F27B 17/0025 219/395 |
| 2011/0089166 A1 | 4/2011 | Hunter et al. | |
| 2012/0145697 A1 | 6/2012 | Komatsu et al. | |

FOREIGN PATENT DOCUMENTS

| | | |
|---|---|---|
| JP | H09-237763 A | 9/1997 |
| JP | H09-240650 A | 9/1997 |
| JP | 2002-270532 A | 9/2002 |
| JP | 2002-270533 A | 9/2002 |
| JP | 2003-022982 A | 1/2003 |
| JP | 2009-200330 A | 9/2009 |
| KR | 10-2009-0130959 A | 12/2009 |

OTHER PUBLICATIONS

International Search Report and Written Opinion dated Aug. 23, 2013 for PCT Application No. PCT/US2013/037585.

* cited by examiner

SUBSTRATE PROCESSING SYSTEM WITH LAMPHEAD HAVING TEMPERATURE MANAGEMENT

CROSS-REFERENCE TO RELATED APPLICATIONS

This application claims benefit of U.S. provisional patent application Ser. No. 61/638,619, filed Apr. 26, 2012, and U.S. provisional patent application Ser. No. 61/707,938, filed Sep. 29, 2012, which are herein incorporated by reference in their entireties.

FIELD

Embodiments of the present invention generally relate to thermal substrate processing systems.

BACKGROUND

Some methods of processing a substrate, for example, epitaxial deposition processes, may be sensitive to temperature in the processing environment of a process chamber. For example, one or more components that may affect temperature of the processing environment may be the chamber walls and/or surfaces where heat can be exchanged with the processing environment.

Accordingly, the inventors provide improved apparatus for heating and temperature management for use a substrate processing system.

SUMMARY

Apparatus for processing a substrate are provided herein. In some embodiments, a lamphead for use in substrate processing includes a monolithic member having a contoured surface; a plurality of reflector cavities disposed in the contoured surface, wherein each reflector cavity is shaped to act as a reflector or to receive a replaceable reflector for a lamp; and a plurality of lamp passages, wherein each lamp passage extends into the monolithic member from one of the plurality of reflector cavities.

In some embodiments, an apparatus for processing a substrate includes a processing chamber having a processing volume; a dome separating the processing volume from an external volume and having a contoured outer surface; and a lamphead disposed in the external volume and configured to provide energy to the processing volume through the dome, the lamphead further comprising a monolithic member having a first contoured surface that substantially matches the contoured outer surface of the dome; a plurality of reflector cavities disposed in the first contoured surface, wherein each reflector cavity is shaped to act as a reflector or to receive a replaceable reflector for a lamp; and a plurality of lamp passages, wherein each lamp passage extends into the monolithic member from one of the plurality of reflector cavities.

In some embodiments, the apparatus further includes a plurality of coolant passages disposed in the monolithic member and proximate to the plurality of lamp passages.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1A:
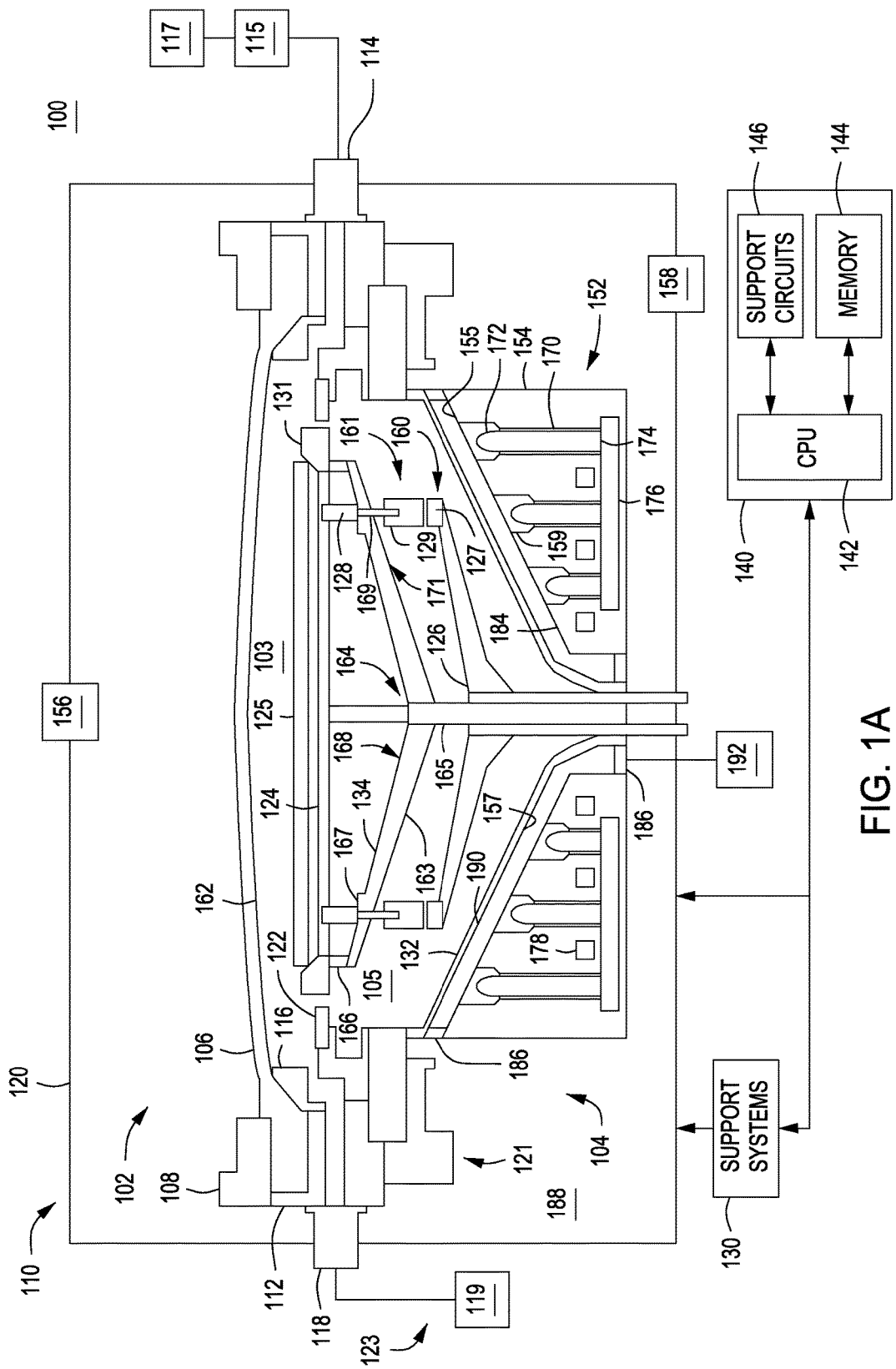
FIG. 1A depicts a schematic view of a substrate processing system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for processing a substrate are provided herein. The inventive apparatus includes a lamphead that may advantageously act as both a heat source to heat a substrate disposed in a process chamber as well as a heat sink to remove heat from the process chamber. Accordingly, the inventive apparatus may advantageously regulate the temperature of one or more components of the process chamber, such as a lower dome adjacent to the lamphead and/or the processing environment of the process chamber while providing heat to the process chamber for processing the substrate. Other and further embodiments of the inventive apparatus are discussed below.

Embodiments of the inventive methods disclosed herein may be used in any suitable process chamber, including those adapted for performing epitaxial deposition processes, such as the RP EPI® reactor, available from Applied Materials, Inc. of Santa Clara, Calif. Other process chambers that utilize lamps to provide heat may also benefit from modification in accordance with the teachings provided herein. An exemplary process chamber is described below with respect to FIG. 1, which depicts a schematic, cross-sectional view of a semiconductor substrate process chamber 100 suitable for performing portions of the present invention. In some embodiments, the process chamber 100 may be adapted for performing epitaxial deposition processes as discussed above and illustratively comprises a chamber body 110, support systems 130, and a controller 140. The chamber body 110 generally includes an upper portion 102 having a first inner volume 103, a lower portion 104 having a second inner volume 105, and an enclosure 120. The first and second inner volumes 103, 105 may comprise the processing volume of the chamber. The process chamber depicted in FIG. 1 is illustrative only and the present inventive methods may be used to advantage in other process chambers as well, including those configured for processes other than epitaxial deposition processes.

A vacuum system 123 may be coupled to the chamber body 110 to facilitate maintaining a desired pressure within the chamber body 110. In some embodiments, the vacuum system 123 may comprise a throttle valve and vacuum pump 119 which are used to exhaust the chamber body 110. In some embodiments, the pressure inside the chamber body 110 may be regulated by adjusting the throttle valve and/or vacuum pump 119.

The upper portion 102 is disposed on the lower portion 104 and includes a lid 106, a clamp ring 108, a liner 116, a baseplate 112, and an upper pyrometer 156. In some embodiments, the lid 106 has a dome-like form factor (e.g., an upper dome 162 in FIG. 1), however, lids having other form factors (e.g., flat or reverse-curve lids) are also contemplated. The lower portion 104 is coupled to a first gas inlet port 114 and an exhaust port 118 and comprises a lower clamp ring 121, a lower dome 132, a substrate support 124, a substrate lift assembly 160, a substrate support assembly 164, a pre-heat ring 122, a lamphead 152, and a lower pyrometer 158. Although the term "ring" is used to describe certain components of the process chamber, such as the pre-heat ring 122 or a susceptor ring 131 (discussed below), it is contemplated that the shape of these components need not be circular and may include any shape, including but not limited to, rectangles, polygons, ovals, and the like. A gas source 117 may be coupled to the chamber body 110 to provide one or more process gases thereto. In some embodiments, a purifier 115 may be coupled to the gas source 117 to filter or purify the one or more process gases prior to entering the chamber body 110.

Figure 1B:
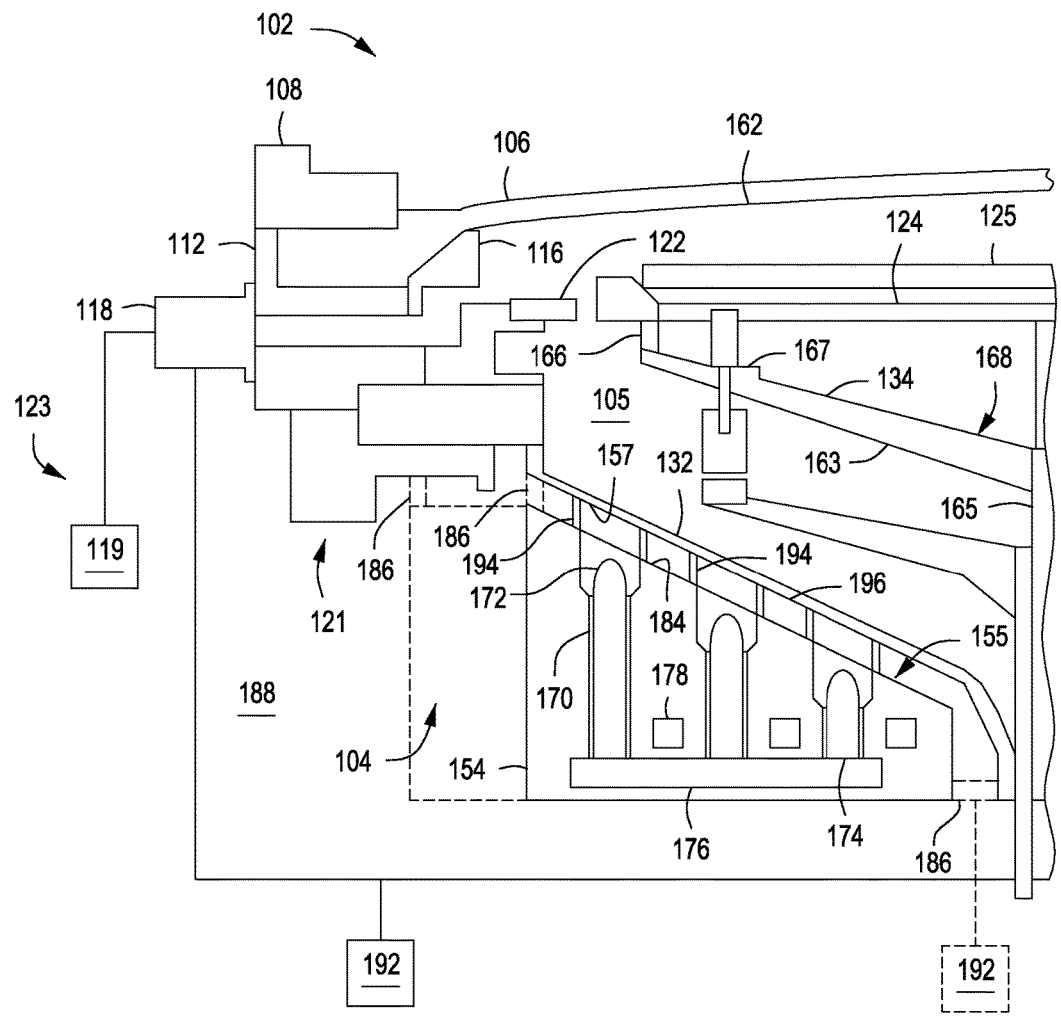
FIG. 1B depicts a partial schematic view of a substrate processing system in accordance with some embodiments of the present invention.

The lamphead 152, as illustrated in FIGS. 1A-B, may include a monolithic member 154 having a contoured surface 155. The contoured surface 155, in some embodiments and as illustrated, may substantially match a contoured outer surface 157 of the lower dome 132. The matching of the contoured surface 155 with the contoured outer surface 157 may, for example, facilitate uniform heating and/or heat removal along the radius of the lower dome 132. The monolithic member 154 may be formed from materials having a high effective thermal conductivity. In some embodiments, materials may include at least one of stainless steel, copper, or aluminum. The thermal conductivity of such materials may be about 10-1000 W/mK, or in some embodiments, about 10-500 W/mK. In some embodiments, the monolithic member is formed from copper, having a thermal conductivity of about 400 W/mK.

The monolithic member 154 includes a plurality of reflector cavities 159 disposed in the contoured surface 155. As illustrated in FIGS. 1A-B, each reflector cavity 159 may be recessed in the contoured surface 155. Each reflector cavity 159 may be shaped to act as a reflector or to receive a replaceable reflector for a lamp. For example, in some embodiments, each reflector cavity 159 may have an inner surface coated with a light reflecting material. The light reflecting material may include any suitable light reflecting material, such as gold, silver, aluminum, or a dielectric quarter-wave stack formed on top of an adhesion layer. The adhesion layer may comprise any materials suitable to secure the light reflecting material to the inner surface of the reflector cavity 159, and may be dependent on a composition of the substrate. In some embodiments, a barrier layer may be disposed atop the light reflecting material to prevent diffusion of substrate materials into the light reflecting material, thereby preventing a reduction of reflectivity of the light reflecting material. In some embodiments, each reflector cavity 159 may be sized to receive an insert, wherein the insert is a reflector for the lamp.

The plurality of reflector cavities 159 may define an open area in the contoured surface 155 of about 10 to about 80 percent of the total surface area of the contoured surface 155 (e.g., the surface area that is adjacent to the lower dome when installed), or about 20 to about 70 percent, or about 20 to about 60 percent, of the total surface area of the contoured surface 155, although other percentages may be used depending upon the application. The remaining portion of the surface area, or web area, may be about 20 to about 90 percent of the total surface area of the contoured surface 155, or of about 30 to about 80 percent, or about 40 to about 80 percent, of the total surface area of the contoured surface 155, although other percentages may be used depending upon the application. As used herein the total surface area of the contoured surface 155 means the total surface area if no reflector cavities 159 were present. For example, if the area of the contoured surface occupied by reflector cavities 159 was equal to a remaining surface area 184 of the contoured surface 155, the open area would be 50 percent. The open area percentage selected may be a balance between providing sufficient energy to heat the substrate during processing while simultaneously providing the remaining surface area 184 of the contoured surface 155 to facilitate heat transfer from the lower dome or other adjacent process chamber components. The reflector cavities 159 may be minimized to minimize the open area, thus maximizing the remaining surface area 184 of the contoured surface 155 to facilitate heat transfer between the contoured surface 155 and the dome 132. The reflector cavities 159 may be minimized, for example, by using smaller lamps, more efficient reflector materials, such as silver or the like, or by using configurations of the reflector cavities 159 which minimize the surface area occupied while maintaining a desired lamp intensity directed toward the process chamber.

The monolithic member 154 includes a plurality of lamp passages 170, where each lamp passage 170 extends into the monolithic member 154 from a corresponding reflector cavity 159. In some embodiments one lamp passage 170 may be provided for each corresponding reflector cavity 159, for example, for use with linear lamps. In some embodiments two lamp passages 170 may be provided for each corresponding reflector cavity 159, for example, for use with u-shaped or arced lamps where each leg extends into a lamp passage and the central region is disposed in the reflector cavity 159, for example, such as described below. In some embodiments, a first one of the plurality of lamp passages 170 may be a different length than a second one of the plurality of lamp passages 170 as illustrated in FIGS. 1A-B. In some embodiments, a first one of the plurality of lamp passages 170 disposed farther from a central axis of the monolithic member 154 may have a longer length than a second one of the plurality of lamp passages disposed closer to the central axis of the monolithic member 154. Accordingly, the plurality of lamps 172 occupying the plurality of lamp passages 170 may vary in length as shown.

The varying lengths of the plurality of lamp passages 170 may be selected such that a plurality of opposing ends 174 of the plurality of lamp passages 170, where each opposing end 174 opposes the contoured surface 155, are disposed in a common plane as illustrated in FIGS. 1A-B. For example, the opposing ends 174 of the plurality of lamp passages 170 may be disposed adjacent to a printed circuit board (PCB) 176 which may be utilized to provide power to each lamp 172 disposed in each lamp passage 170.

The lamphead 152 may include a plurality of coolant passages 178 disposed in the monolithic member 154 and proximate to the plurality of lamp passages 170. The coolant passages 178 may be used to circulate a coolant for cooling each lamp 172. Further, the coolant may be used for regulating the temperature of the lower dome 132, such as by withdrawing heat from the dome 132 via transfer between the dome 132 and the open area 184. In some embodiments, the coolant may contain little or no dissolved oxygen or oxidizing agents contained therein, thereby limiting erosion and/or corrosion of the coolant passages 178. In some embodiments, the coolant contains less than about 0.1 ppm oxygen equivalent of oxidizing agents. Water with reduced dissolved oxygen may be obtained by vacuum degassing, boiling, membrane filtration, and nitrogen sparging. In some embodiments, the coolant may include reducing agents, such as tannins, hydrazine, hydroquinone/progallol-based derivatives, hydroxylamine derivatives, ascorbic acid derivatives, and other materials generally known in the boiler water treatment industry. In some embodiments, the coolant passages 178 may include elements for increasing surface area within the coolant passage for heat transfer, such as fins, cylinders, or the like which may improve heat transfer between the coolant passages 178 and the coolant.

Figure 2:
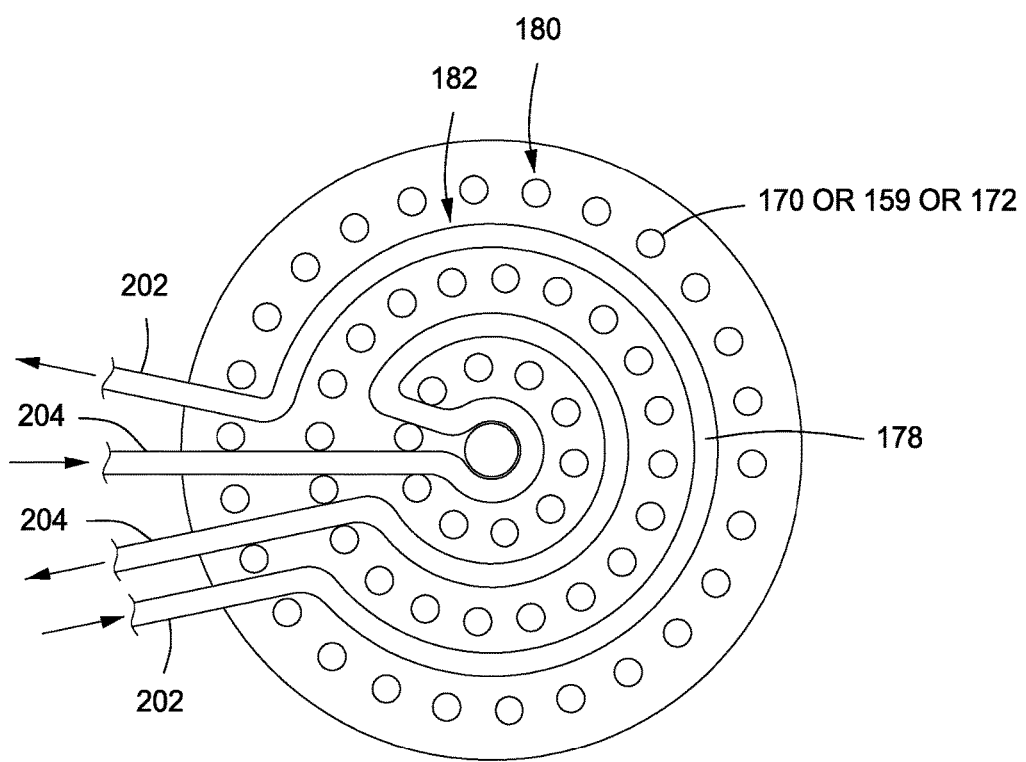
FIG. 2 depicts a top down schematic view of a lamphead in accordance with some embodiments of the present invention.

One exemplary arrangement of the plurality of lamp passages 170 and the plurality of coolant passages 178 is depicted in a top down schematic view of the lamphead 152 as illustrated in FIG. 2. As shown, the plurality of lamp passages 170 may be arranged in a plurality of first concentric rings 180 about a central axis of the monolithic member 154 and the plurality of coolant passages 178 may be generally arranged in a plurality of second concentric rings 182 about the central axis of the monolithic member 154. For example, in some embodiments, the plurality of coolant passages 178 may include at least a first coolant loop 202 and a second coolant loop 204. Each coolant loop is generally arranged in a concentric ring and includes an inlet and an outlet to facilitate flow of a heat transfer fluid through the coolant loops. In some embodiments, the pluralities of first concentric rings 180 and second concentric rings 182 can be alternately disposed about the central axis of the monolithic member 154 as illustrated in FIG. 2.

Figure 3:
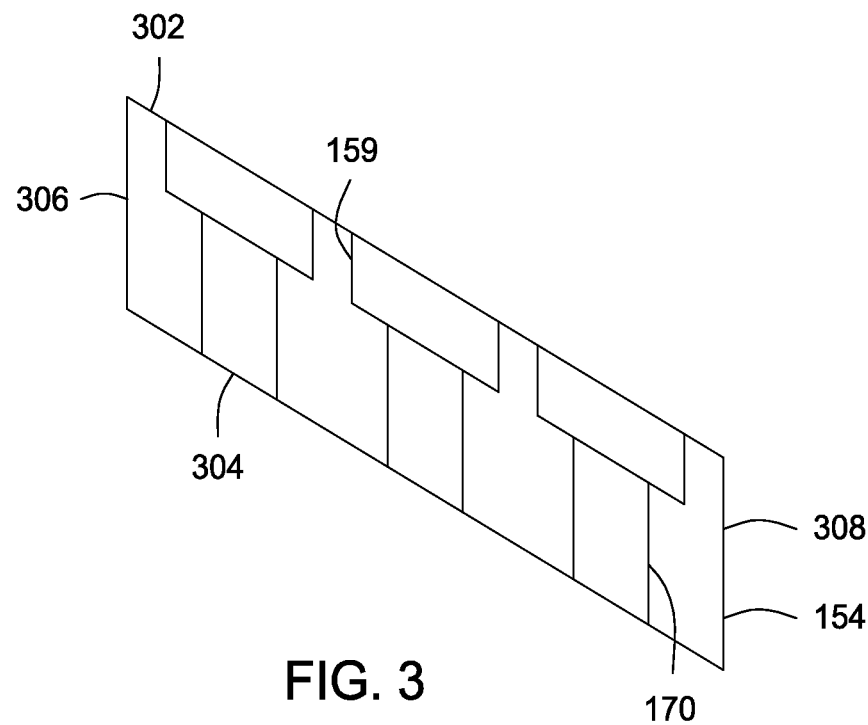
FIG. 3 depicts a side cross sectional view of a portion of a lamphead in accordance with some embodiments of the present invention.
Figure 4:
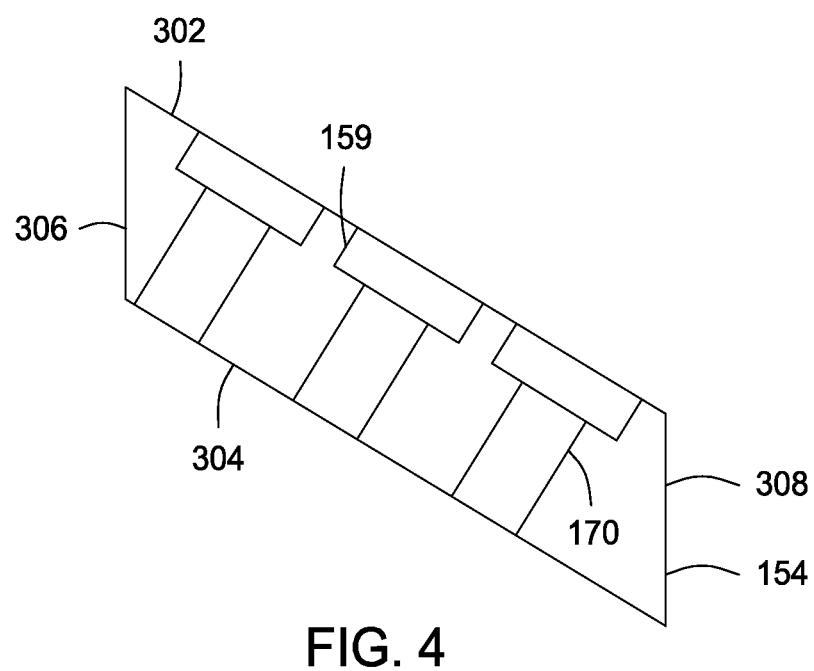
FIG. 4 depicts a side cross sectional view of a portion of a lamphead in accordance with some embodiments of the present invention.
Figure 5:
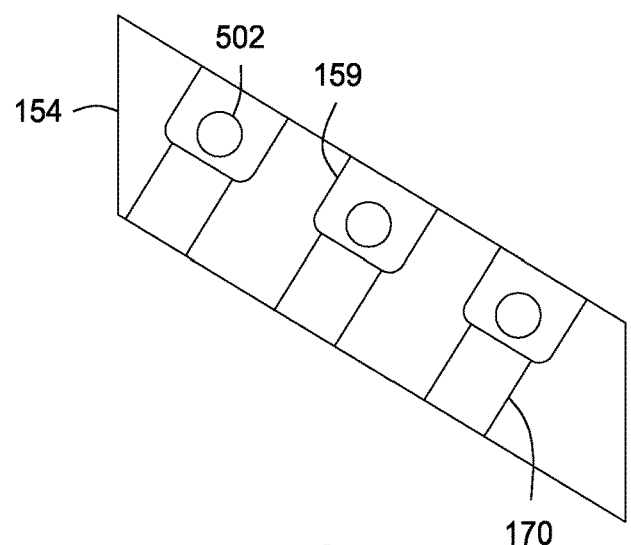
FIG. 5 depicts a side cross sectional view of a portion of a lamphead in accordance with some embodiments of the present invention.

Although shown having a particular shape in FIGS. 1A-B, the monolithic member 154 and/or the plurality of lamp passages 170 may have any size or shape suitable to allow the lamphead 152 to function as a heat source and/or heat sink in accordance with a particular application. For example, in some embodiments and as depicted in FIGS. 3-5, the monolithic member 154 may be shaped such that a top 302 and bottom 304 of the monolithic member 154 are substantially parallel to one another. In such embodiments, the lamp passages 170 may be disposed such that each of the lamp passages 170 is oriented substantially parallel to at least one of the sides 306, 308 of the monolithic member 154, as depicted in FIG. 3. Alternatively, in some embodiments, the lamp passages 170 may be disposed such that each of the lamp passages 170 is oriented substantially perpendicular to the top 302 and/or bottom 304 of the monolithic member 154, such as shown in FIG. 4.

Although the cavities 159 are shown above as isolated from one another and each having an end of a lamp 172 disposed therein (e.g., as shown in FIG. 2), in some embodiments, the cavities 159 may be troughs or channels formed in the monolithic member 154, wherein at least a portion of one or more lamps are disposed within the trough or channel (e.g., as illustrated by a cross sectional view of a portion of a lamp at 502), for example, such as shown in FIG. 5.

Figure 6:
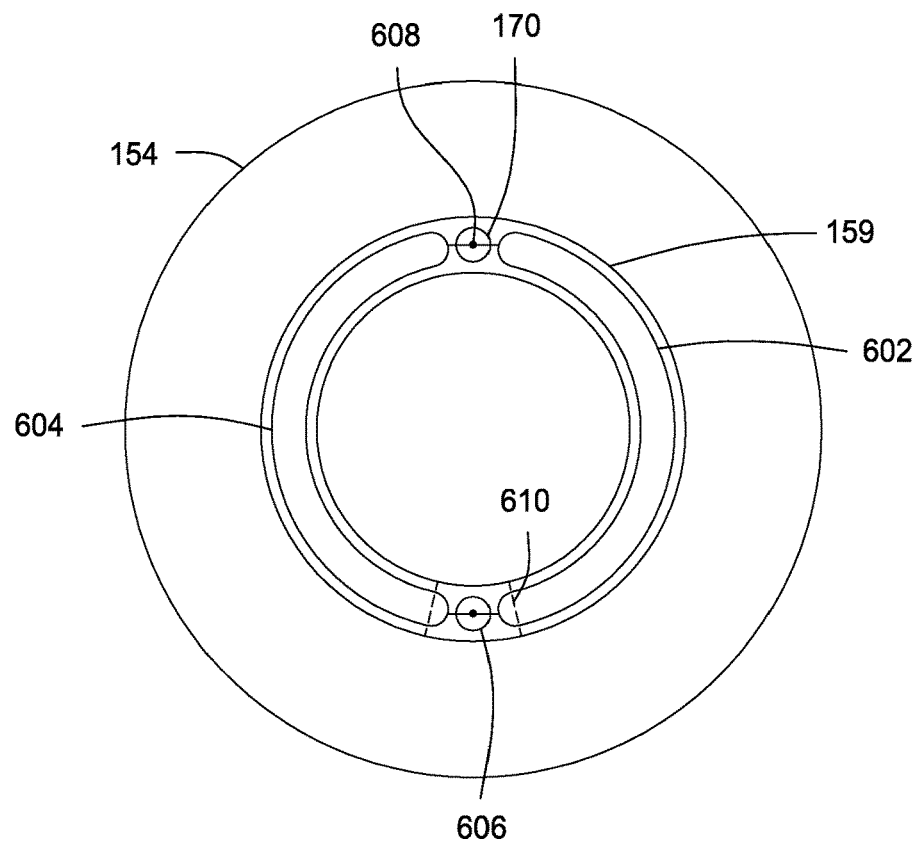
FIG. 6 depicts a top down schematic view of a lamphead in accordance with some embodiments of the present invention.

For example, referring to FIG. 6, in some embodiments, one or more of the cavities (one cavity 159 shown) may be a continuous channel formed in the monolithic member 154. In some embodiments, the cavity 159 may be configured to accommodate one or more curved or c-shaped lamps (two c-shaped lamps 602, 604 shown) disposed within the cavity 159. In such embodiments, power may be provided to the c-shaped lamps 602, 604 via an electrical coupling 606, 608 through the lamp passages 170. In some embodiments, an optional radiation shield 610 may be disposed over the cavity 159 above the electrical coupling 606, 608 to protect the coupling 606, 608 during processing.

Figure 7:
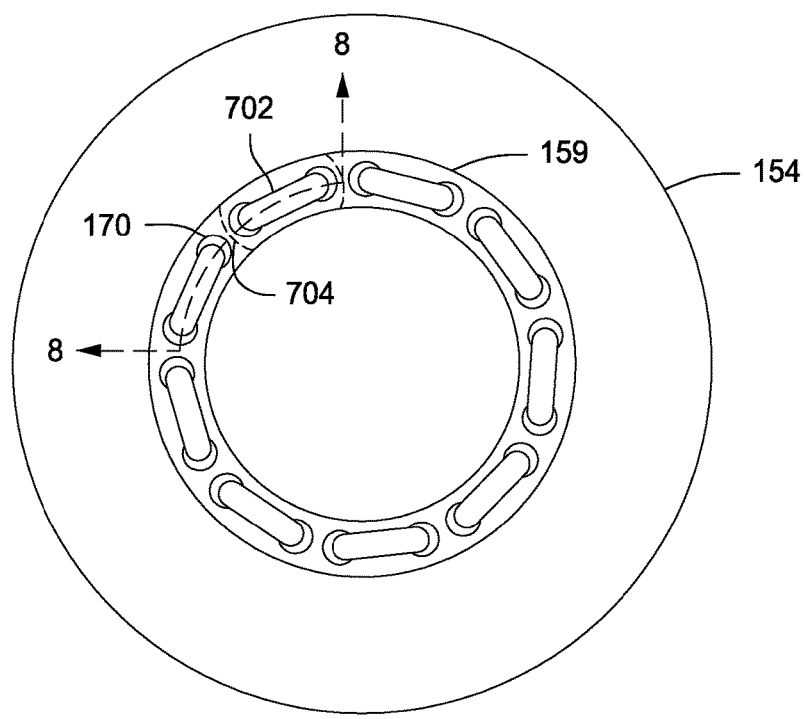
FIG. 7 depicts a top down schematic view of a lamphead in accordance with some embodiments of the present invention.
Figure 8:
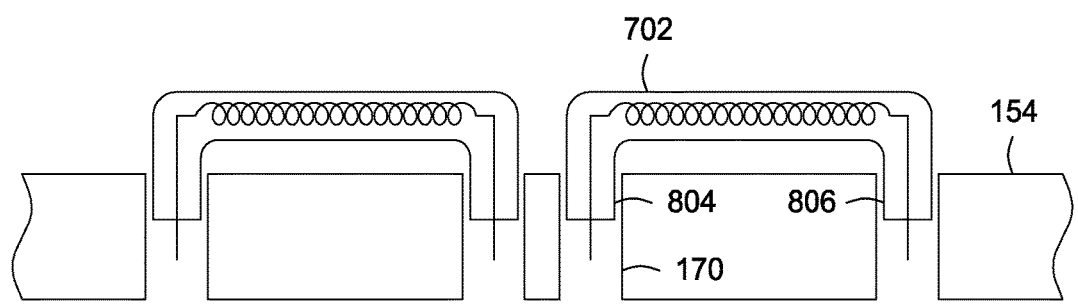
FIG. 8 depicts a side cross sectional view of a portion of a lamphead in accordance with some embodiments of the present invention.

In some embodiments, a plurality of u-shaped lamps 702 may be disposed within the cavity 159, for example, such as shown in FIG. 7. In such embodiments, the cavity 159 may be one continuous channel formed in the monolithic member 154, such as shown in FIG. 7, or alternatively, a plurality of separate cavities, wherein each cavity has one or more of the u-shaped lamps 702 disposed therein (e.g., cavity 704 shown in phantom). In some embodiments, a first end 804 and a second end 806 of each of the plurality of u-shaped lamps may be at least partially disposed within the lamp passages 170, for example, such as shown in FIG. 8. In some embodiments, power may be provided to the lamps via the lamp passages 170.

Figure 9:
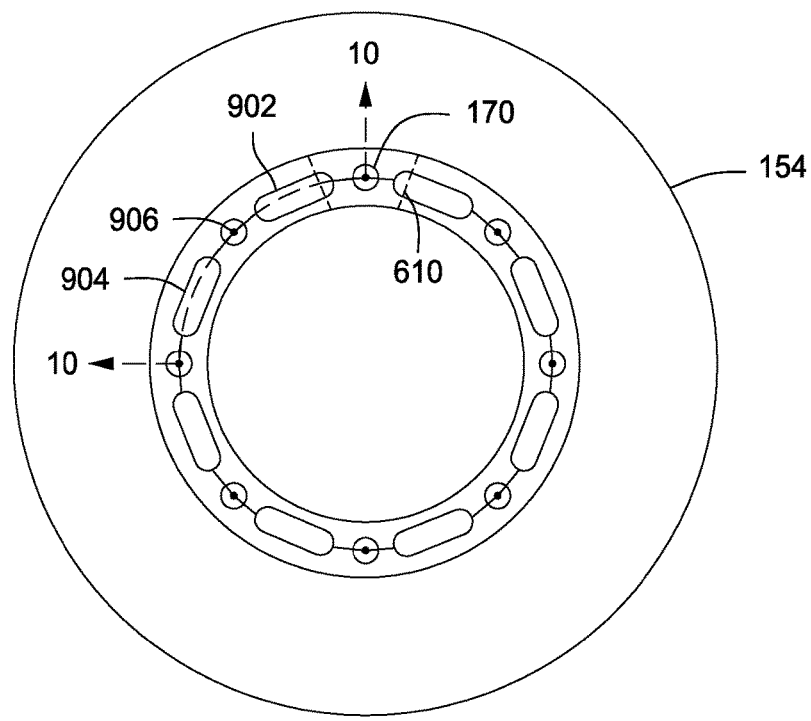
FIG. 9 depicts a top down schematic view of a lamphead in accordance with some embodiments of the present invention.
Figure 10:
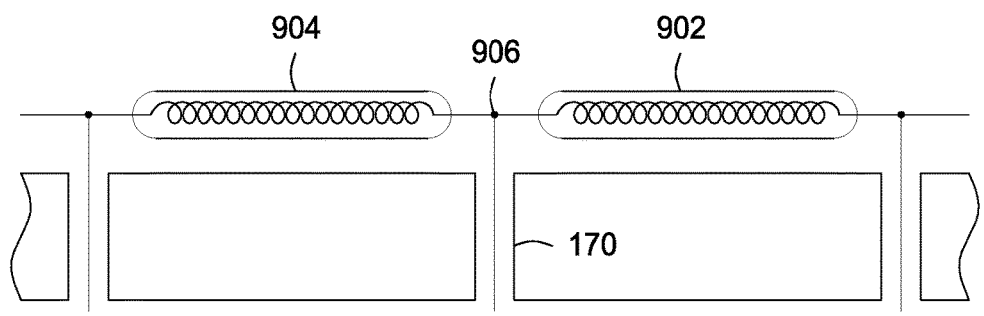
FIG. 10 depicts a side cross sectional view of a portion of a lamphead in accordance with some embodiments of the present invention.
Figure 11:
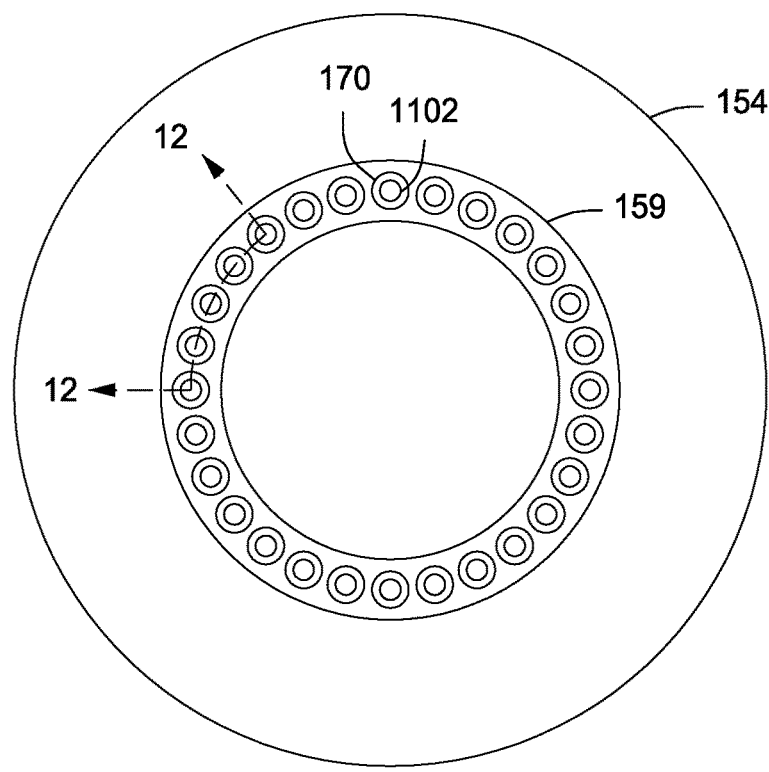
FIG. 11 depicts a top down schematic view of a lamphead in accordance with some embodiments of the present invention.
Figure 12:
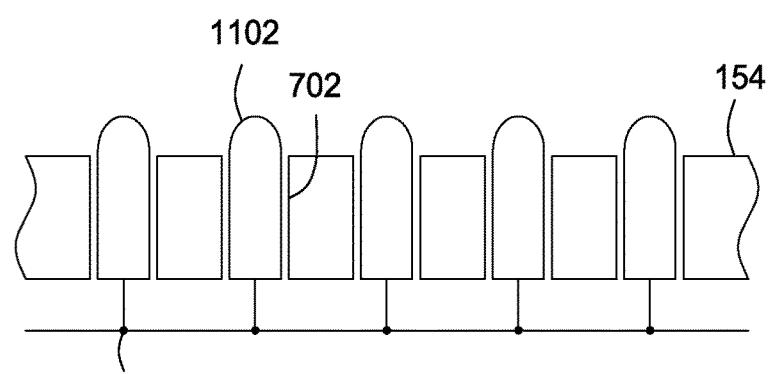
FIG. 12 depicts a side cross sectional view of a portion of a lamphead in accordance with some embodiments of the present invention.

In some embodiments, a plurality of linear lamps (lamps 902 and 904 shown) may be disposed within the cavity 159 such that each of the plurality of linear lamps are disposed between the lamp passages 170, for example, such as shown in FIGS. 9-10. In such embodiments, power may be provided to the linear lamps 902, 904 via an electrical coupling 906 through the lamp passages 170. Referring to FIG. 11, in some embodiments, each lamp passage 170 may accommodate a lamp 1102 such that at least a portion of each lamp 1102 is disposed within the cavity 159. In such embodiments, power may be provided to the lamps 1102 via an electrical coupling 1202 disposed beneath the monolithic member 154, such as shown in FIG. 12.

Returning to FIGS. 1A-B, in some embodiments, one or more seals 186 may be used to isolate at least a portion of an external volume 188 (e.g., the external volume 188 being the volume contained by the enclosure 120 external to the lid 106 and the lower dome 132) disposed between the contoured outer surface 157 of the lower dome 132 and the contoured surface 155 of the monolithic member 154 from the remainder of the external volume 188. In some embodiments, the seal 186 may be disposed directly between the contoured outer surface 157 of the dome 132 and the contoured surface 155 of the monolithic member 154 along both peripheral edges (as shown in FIG. 1A). Alternatively or in combination, in some embodiments the seal 186 disposed along the outer periphery of the monolithic member 154, or an additional seal, may be disposed between the monolithic member 154 and the baseplate assembly 121 (as shown in phantom).

The seal 186 may comprise any process-compatible material. In some embodiments, the seal 186 may be fabricated from boron nitride (BN), graphoil (exfoliated graphite), or an elastomer such as a fluorocarbon elastomer or a high temperature silicone elastomer. In some embodiments, the seal 186 may be a bladder seal, for example, an inflatable seal that can be inflated and deflated to facilitate selectively providing the seal. Such seals may be particularly useful for the seal proximate the central axis of the lamphead to facilitate installation and removal of the lamphead.

In some embodiments, as illustrated in FIG. 1A, the seal 186 may isolate a region 190 of the external volume 188 disposed between the contoured surface 155 and the contoured outer surface 157 of the dome 132. A fluid source 192 may be used to provide a fluid to the region 190 isolated by the seals 186. The fluid may be used to control energy transfer between the lamphead 152 and at least one of the dome 132 or the processing volume of the process chamber 100. The fluid may be used to control at least one of energy provided by the lamps 172 to the dome 132 and/or processing volume and/or the energy transferred from the dome 132 to the remaining surface area 184 of the contoured surface 155.

The fluid may be flowing or static within the region 190. Exemplary fluids may include one or more gases, such as helium (He), nitrogen ($N_2$) or the like, or liquids, such water ($H_2O$), which may further comprise ionic salts, quaternary ammonium salts, or the like.

Alternatively or in combination with the seals 186 and/or 194, the web areas disposed between the lamphead and the lower dome can be filled with compliant solids fill area b/w lamphead and dome, leaving the open areas open. The compliant solids may have a base thermal conductivity of about 1 W/mK to about 400 W/mK. Suitable compliant solids include graphoil, wire fabric (stainless, copper), ceramic fabrics (aluminum nitride, alumina), compliant metal laminate structures, or the like.

Alternative embodiments of the seal and fluid source are illustrated in FIG. 1B. As shown, a seal 194 may be disposed about each individual reflector cavity 159. Alternatively, the seal 194 may be disposed about each first concentric ring 180 which includes the reflector cavities 159. Optionally, as shown by the dotted lines, the seal 194 may enclose the portion of the external volume 188 disposed between the contoured surface 155 and the contoured outer surface 157 of the lower dome 132. Accordingly, as illustrated in FIG. 1B in alternative view, the fluid source 192 may be coupled to, and provide the fluid to, a region 196 of the external volume 188 which is disposed between the contoured surface 155 and the contoured outer surface 157 of the lower dome 132 but that excludes the area directly above each reflector cavity 159. However, in some embodiments, the seal 194 may isolate each of the reflector cavities 159 from the external volume 188 but not the region 196. Accordingly, in such embodiments the fluid source 192 may be coupled directly to the external volume 188 as illustrated in the primary view in FIG. 1B. In the case of multiple separated fluid regions, paths or seals may be provided to permit flow from one region to the next to allow a continuous path (or multiple continuous paths) from inlet to outlet.

During processing, a substrate 125 is disposed on the substrate support 124. The lamphead 152 is a source of infrared (IR) radiation (i.e., heat) and, in operation, generates a pre-determined temperature distribution across the substrate 125. Further, embodiments of the inventive apparatus, such as providing fluid from the fluid source 192 and/or circulating a coolant through the plurality of coolant passages 178 may be utilized control temperature distribution along the radius of the lower dome 132 and/or with the processing volume. In some embodiments, the lid 106, and the lower dome 132 are formed from quartz (e.g., opaque quartz, transparent quartz, partially transparent quartz, or the like); however, other process compatible materials may also be used to form these components.

In some embodiments, the substrate support 124 generally includes a susceptor ring 131 supported, a substrate support assembly 164 for supporting the susceptor ring 131 thereon, and a substrate lift assembly 160. Other and further embodiments of a substrate support that may be adapted to benefit from the invention is described in U.S. patent application Ser. No. 13/028,842, filed Feb. 16, 2011 by Myo, et al., and entitled "METHOD AND APPARATUS FOR DEPOSITION PROCESSES". Other and further embodiments of a substrate support are also possible. The susceptor ring 131 may have an inner edge for supporting the substrate 125 thereon. The susceptor ring 131 may comprises at least one of silicon carbide coated graphite, solid silicon carbide, solid sintered silicon carbon, or solid metal-free sintered silicon carbide. In some embodiments, the substrate support may include a multi-pin support with no underlying susceptor. For example, in some embodiments, the substrate support 124 may not include the susceptor ring 131 and the substrate 125 may be supported directly by one or more support pins (e.g., support pin 166), for example, three or more support pins. In such embodiments, the inventors have observed that by providing the substrate support 124 without a susceptor ring 131, the thermal mass of the substrate support 124 may be reduced.

The substrate support assembly 164 generally includes a central support 165 having a supporting member 163 radially extending therefrom for supporting the susceptor ring 131 thereon. The supporting member 163 includes a plurality of lift pin supporting surfaces 167 on a susceptor ring facing side 168 of the supporting member 163. Each lift pin supporting surface 167 has a lift pin hole 169 disposed therethrough between the susceptor ring facing side 168 and a backside 171 of the supporting member 163. Each lift pin hole 169 may be configured to have a lift pin 128 moveably disposed therethrough. Each lift pin supporting surface 167 may be configured to support a lift pin 128 when the lift pin is in a retracted position.

In some embodiments, the supporting member 163 further comprises a plurality of support arms 134. Each support arm 134 may have a lift pin supporting surface 167 disposed thereon and a lift pin hole 169 disposed therethrough. In some embodiments, each support arm 134 may further include a support pin 166 for coupling the support arm to the susceptor ring 131. In some embodiments, the number of support arms 134 is three and the number of lift pins 128 is three.

Alternatively, and not shown, the supporting member may a single-piece conical member. The conical member may further include a plurality of vents disposed therethrough for fluidly coupling the backside of the substrate 125 to the second inner volume 105 of the process chamber 100. In such embodiments, the conical member may be absorptive or transmissive of radiant energy provided during processing, to control the temperature of the substrate as desired.

The substrate lift assembly 160 may be disposed about the central support 165 and axially moveable therealong. The substrate lift assembly 160 comprises a substrate lift shaft 126 and a plurality of lift pin modules 161 selectively resting on respective pads 127 of the substrate lift shaft 126. In some embodiments, a lift pin module 161 comprises an optional base 129 where the lift pin 128 coupled to the base 129. Alternatively, a bottom portion of the lift pin 128 may rest directly on the pads 127. In addition, other mechanisms for raising and lowering the lift pins 128 may be utilized.

The support systems 130 include components used to execute and monitor pre-determined processes (e.g., growing epitaxial films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 may be provided and coupled to the process chamber 100 for controlling the components of the process chamber 100. The controller 140 may be any suitable controller for controlling the operation of a substrate process chamber. The controller 140 generally comprises a Central Processing Unit (CPU) 142, a memory 144, and support circuits 146 and is coupled to and controls the process chamber 100 and support systems 130, directly (as shown in FIG. 1) or, alternatively, via computers (or controllers) associated with the process chamber and/or the support systems.

The CPU 142 may be any form of a general purpose computer processor that can be used in an industrial setting. The support circuits 146 are coupled to the CPU 142 and may comprise cache, clock circuits, input/output subsystems, power supplies, and the like. Software routines, such as to control the methods for processing substrates as disclosed herein, may be stored in the memory 144 of the controller 140. The software routines, when executed by the CPU 142, transform the CPU 142 into a specific purpose computer (controller) 140. The software routines may also be stored and/or executed by a second controller (not shown) that is located remotely from the controller 140. Alternatively or in combination, in some embodiments, for example where the process chamber 100 is part of a multi-chamber processing system, each process chamber of the multi-chamber processing system may have its own controller for controlling portions of the inventive methods disclosed herein that may be performed in that particular process chamber. In such embodiments, the individual controllers may be configured similar to the controller 140 and may be coupled to the controller 140 to synchronize operation of the process chamber 100.

While the foregoing is directed to embodiments of the present invention, other and further embodiments of the invention may be devised without departing from the basic scope thereof.

The invention claimed is:

1. A lamphead for use in substrate processing, comprising: a monolithic member having an upper contoured surface that is downwardly angled from an outer peripheral edge toward the center of the monolithic member, wherein the contoured surface is configured to substantially match a contoured outer surface of a dome separating a processing volume from an external volume to facilitate uniform heating and/or heat removal along a radius of the dome, wherein the monolithic member is an annular ring having a central opening configured to allow a substrate support shaft to pass through the central opening, wherein the monolithic member is formed from materials having an effective thermal conductivity of at least 400 W/mK, and wherein the monolithic member is configured to act as a heat sink and facilitate removal of heat during substrate processing; a plurality of reflector cavities disposed beneath and extending into the contoured surface, wherein each reflector cavity is shaped to act as a reflector or to receive a replaceable reflector for a lamp; and a plurality of lamp passages, wherein each lamp passage extends into the monolithic member from one of the plurality of reflector cavities, wherein a first one of the plurality of lamp passages disposed farther from a central axis of the monolithic member has a longer length than a second one of the plurality of lamp passages disposed closer to the central axis of the monolithic member.

2. The lamphead of claim 1, further comprising:
   a plurality of coolant passages disposed in the monolithic member and proximate to the plurality of lamp passages.

3. The lamphead of claim 2, wherein the plurality of lamp passages are arranged in a plurality of first arcs concentric about a central axis of the monolithic member and wherein the plurality of coolant passages are disposed in a plurality of second concentric rings about the central axis of the monolithic member.

4. The lamphead of claim 1, wherein each lamp passage extends into the monolithic member from a corresponding reflector cavity of the plurality of reflector cavities, and wherein each lamp passage is configured to accommodate a lamp.

5. The lamphead of claim 1, wherein at least two lamp passages extend into the monolithic member from a reflector cavity of the plurality of reflector cavities, and wherein at least a portion of at least one lamp is disposed within the reflector cavity of the plurality of reflector cavities.

6. The lamphead of claim 5, wherein a first end of the at least one lamp is disposed in one of the at least two lamp passages extending from the reflector cavity and a second end of the at least one lamp is disposed in another of the at least two lamp passages extending from the reflector cavity.

7. The lamphead of claim 1, wherein the plurality of reflector cavities define an open area in the contoured surface of about 10 to about 80 percent of the total area of the contoured surface.

8. An apparatus for processing a substrate, comprising: a processing chamber having a processing volume; a dome separating the processing volume from an external volume and having a contoured outer surface; and a lamphead disposed in the external volume and configured to provide energy to the processing volume through the dome, the lamphead further comprising: a monolithic member having a first contoured surface that is disposed adjacent to and substantially matches the contoured outer surface of the dome, wherein the first contoured surface is downwardly angled from an outer peripheral edge toward the center of the monolithic member, wherein the contoured surface is configured to substantially match a contoured outer surface of the dome to facilitate uniform heating and/or heat removal along the radius of the dome, wherein the monolithic member is an annular ring having a central opening configured to allow a substrate support shaft to pass through the central opening, wherein the monolithic member is formed from materials having an effective thermal conductivity of at least 400 W/mK, and wherein the monolithic member is configured to act as a heat sink and facilitate removal of heat during substrate processing; a plurality of reflector cavities disposed beneath and extending into the first contoured surface, wherein each reflector cavity is shaped to act as a reflector or to receive a replaceable reflector for a lamp; and a plurality of lamp passages, wherein each lamp passage extends into the monolithic member from one of the plurality of reflector cavities, wherein a first one of the plurality of lamp passages disposed farther from a central axis of the monolithic member has a longer length than a second one of the plurality of lamp passages disposed closer to the central axis of the monolithic member.

9. The apparatus of claim 8, further comprising:
a seal isolating at least a portion of the external volume disposed between the contoured outer surface of the dome and the first contoured surface of the monolithic member from the remainder of the external volume.

10. The apparatus of claim 8, wherein the seal isolates each reflector cavity from the external volume and adjacent reflector cavities.

11. The apparatus of claim 8, further comprising:
a fluid source to provide a gas to the at least a portion of the external volume isolated by the seal, wherein the gas controls energy transfer between the lamphead and at least one of the dome or processing volume.

12. The apparatus of claim 8, further comprising:
a plurality of coolant passages disposed in the monolithic member and proximate to the plurality of lamp passages.

13. The apparatus of claim 12, wherein the plurality of lamp passages are arranged in a plurality of first concentric rings about a central axis of the monolithic member and wherein the plurality of coolant passages are arranged in a plurality of second concentric rings about the central axis of the monolithic member.

14. The lamphead of claim 8, wherein a plurality of opposing ends of the plurality of lamp passages, wherein each opposing end opposes the contoured surface of the monolithic member, are disposed in common plane.

15. The lamphead of claim 8, wherein each lamp passage extends into the monolithic member from a corresponding reflector cavity of the plurality of reflector cavities, and wherein each lamp passage is configured to accommodate a lamp.

16. The lamphead of claim 8, wherein at least two lamp passages extend into the monolithic member from a reflector cavity of the plurality of reflector cavities, and wherein at least a portion of at least one lamp is disposed within the reflector cavity of the plurality of reflector cavities.

17. The lamphead of claim 16, wherein a first end of the at least one lamp is disposed in one of the at least two lamp passages extending from the reflector cavity and a second end of the at least one lamp is disposed in another of the at least two lamp passages extending from the reflector cavity.

18. An apparatus for processing a substrate, comprising: a processing chamber having a processing volume; a substrate support disposed in the processing volume; a dome separating the processing volume from an external volume and having a contoured outer surface; a lamphead disposed in the external volume and configured to provide energy to the processing volume through the dome, the lamphead further comprising: a monolithic member having a first contoured surface that is disposed adjacent to and substantially matches the contoured outer surface of the dome, wherein the first contoured surface is downwardly angled from an outer peripheral edge toward the center of the monolithic member, wherein the contoured surface is configured to substantially match a contoured outer surface of the dome to facilitate uniform heating and/or heat removal along the radius of the dome, wherein the monolithic member is an annular ring having a central opening configured to allow a substrate support shaft to pass through the central opening, wherein the monolithic member is formed from materials having an effective thermal conductivity of at least 400 W/mK, and wherein the monolithic member is configured to act as a heat sink and facilitate removal of heat during substrate processing; a plurality of reflector cavities disposed beneath and extending into the first contoured surface, wherein each reflector cavity is shaped to act as a reflector or to receive a replaceable reflector for a lamp; a plurality of lamp passages, wherein each lamp passage extends into the monolithic member from one of the plurality of reflector cavities and a plurality of coolant passages disposed in the monolithic member and proximate to the plurality of lamp passages; wherein a first one of the plurality of lamp passages disposed farther from a central axis of the monolithic member has a longer length than a second one of the plurality of lamp passages disposed closer to the central axis of the monolithic member, and a seal isolating at least a portion of the external volume disposed between the contoured outer surface of the dome and the first contoured surface of the monolithic member from the remainder of the external volume.

* * * * *